US008729553B2

(12) United States Patent
Park et al.

(10) Patent No.: US 8,729,553 B2
(45) Date of Patent: May 20, 2014

(54) THIN FILM TRANSISTOR INCLUDING CATALYST LAYER, METHOD OF FABRICATING THE SAME, AND ORGANIC LIGHT EMITTING DIODE DISPLAY DEVICE HAVING THE TFT

(75) Inventors: Jin-Seong Park, Suwon-si (KR); Yeon-Gon Mo, Suwon-si (KR); Hye-Dong Kim, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 988 days.

(21) Appl. No.: 12/341,064

(22) Filed: Dec. 22, 2008

(65) Prior Publication Data

US 2009/0166636 A1    Jul. 2, 2009

(30) Foreign Application Priority Data

Dec. 29, 2007  (KR) .......................... 10-2007-141094

(51) Int. Cl.
*H01L 29/04* (2006.01)
(52) U.S. Cl.
USPC ..................................... 257/72; 257/E23.037
(58) Field of Classification Search
USPC ........... 257/57, 59, 64, 65, 66, 69, 70, 72, 74, 257/75, E27.111, E29.004, E29.286, 257/E29.293, E29.294; 438/158
See application file for complete search history.

(56) References Cited

U.S. PATENT DOCUMENTS

| | | | | |
|---|---|---|---|---|
| 2002/0055208 | A1* | 5/2002 | Ohtani et al. | 438/151 |
| 2005/0040402 | A1* | 2/2005 | Ohtani et al. | 257/72 |
| 2006/0046357 | A1* | 3/2006 | Lee et al. | 438/149 |
| 2006/0091499 | A1 | 5/2006 | Stecker et al. | |

FOREIGN PATENT DOCUMENTS

| | | |
|---|---|---|
| JP | 2000-353666 | 12/2000 |
| KR | 10-1996-0009232 | 3/1996 |
| KR | 10-2002-0091313 | 12/2002 |
| KR | 2003-47571 | 6/2003 |
| KR | 2003-60403 | 7/2003 |
| KR | 2004-70617 | 8/2004 |
| KR | 10-2007-0081218 | 8/2007 |

* cited by examiner

*Primary Examiner* — Thomas L Dickey
(74) *Attorney, Agent, or Firm* — H.C. Park & Associates, PLC

(57) ABSTRACT

A thin film transistor (TFT), a method of fabricating the same, and display device having the TFT of which the TFT includes a metal catalyst layer disposed on a substrate, a semiconductor layer disposed on the metal catalyst layer, a gate insulating layer disposed on the entire surface of the substrate, a gate electrode disposed on the gate insulating layer at a position corresponding to the semiconductor layer, an interlayer insulating layer disposed on the entire surface of the substrate, and source and drain electrodes disposed on the interlayer insulating layer and connected to the semiconductor layer, wherein the metal catalyst layer includes one of carbon, nitrogen, and halogen. The thin film transistor includes a poly-Si layer that may be formed to a smaller thickness than in conventional deposition methods thereby producing a TFT in which the remaining amount of metal catalyst in a semiconductor layer is reduced.

20 Claims, 9 Drawing Sheets

THIN FILM TRANSISTOR INCLUDING CATALYST LAYER, METHOD OF FABRICATING THE SAME, AND ORGANIC LIGHT EMITTING DIODE DISPLAY DEVICE HAVING THE TFT

CROSS-REFERENCE TO RELATED APPLICATIONS

This application claims the benefit of Korean Patent Application No. 2007-141094, filed Dec. 29, 2007, the disclosure of which is incorporated herein by reference.

BACKGROUND OF THE INVENTION

1. Field of the Invention

Aspects of the present invention relate to a thin film transistor (TFT), a method of fabricating the same, and an organic light emitting diode (OLED) display device having the TFT, and more particularly, to a TFT, a method of fabricating the TFT in which an amorphous silicon (a-Si) layer is crystallized by controlling the amount of metal catalyst so as to not adversely affect the device characteristics of the TFT, and an OLED display device having the TFT.

2. Description of the Related Art

In general, a polycrystalline silicon (poly-Si) layer is widely used as a semiconductor layer for a thin film transistor (TFT) because the poly-Si has high field-effect mobility, can be applied to a high-speed operating circuit, and can be used to configure a complementary metal-oxide-semiconductor (CMOS) circuit. A TFT using the poly-Si layer is typically used as an active device of an active-matrix liquid crystal display (AMLCD) or a switching device or a driving device of an organic light emitting diode (OLED).

Methods of crystallizing an a-Si layer into a poly-Si layer may include a solid phase crystallization (SPC) method, an excimer laser crystallization (ELC) method, a metal induced crystallization (MIC) method, and a metal induced lateral crystallization (MILC) method. In the SPC method, an a-Si layer is annealed for several to several tens of hours at temperatures below the temperature of 700° C., a temperature at which a glass substrate used in a TFT for a display device may be deformed. In the ELC method, excimer laser beams are irradiated on an a-Si layer so that the a-Si layer is partially heated to a high temperature in a very short amount of time. In the MIC method, a metal, such as nickel (Ni), palladium (Pd), gold (Au), or aluminum (Al), is brought into contact with or doped into an a-Si layer to induce a phase change of the a-Si layer into a poly-Si layer. In the MILC method, silicide formed by a reaction of metal with silicon laterally diffuses so as to sequentially induce crystallization of an a-Si layer.

However, the SPC method takes too much time and may lead to deformation of a substrate because the substrate is annealed at such a high temperature for a long time. Also, the ELC method requires expensive laser apparatuses and results in formation of protrusions on the resultant poly-Si surface, thereby degrading interfacial characteristics between a semiconductor layer and a gate insulating layer therein. Furthermore, when the MIC or MILC method is employed, a large amount of metal catalyst may remain in a crystallized poly-Si layer, thereby increasing leakage current of a semiconductor layer of a TFT.

A vast amount of research has been conducted on methods of crystallizing an a-Si layer using a metal catalyst because the a-Si layer can be crystallized at a lower temperature for a shorter amount of time than in the SPC method. Typical methods of crystallizing an a-Si layer using a metal catalyst are the MIC method and the MILC method. In these methods, however, the device characteristics of a TFT may be degraded due to contamination caused by the metal catalyst.

In order to prevent the contamination caused by the metal catalyst, a method of fabricating a poly-Si layer by a crystallization method using a capping layer has been disclosed in Korean Patent Publication No. 2003-0060403. In this method, an a-Si layer and a capping layer are deposited on a substrate, and a metal catalyst layer is formed thereon. The substrate is annealed using thermal treatment or a laser so that the metal catalyst is diffused through the capping layer to the a-Si layer to form seeds. Thus, the a-Si layer is crystallized into a poly-Si layer using the seeds. In the above-described method, since the metal catalyst is diffused through the capping layer, excessive metal contamination may be inhibited. However, a large amount of metal catalyst still remains in the poly-Si layer. Therefore, it is necessary to find methods of fabricating poly-Si layers using the smallest amount of metal catalyst.

SUMMARY OF THE INVENTION

Aspects of present invention provide a thin film transistor (TFT), a method of fabricating a TFT in which an amorphous silicon (a-Si) layer is crystallized using an small amount of metal catalyst by forming a metal catalyst layer having a small thickness to thereby improve the characteristics of the TFT, and an organic light emitting diode (OLED) display device having the TFT.

According to aspects of the present invention, a TFT includes: a substrate; a buffer layer disposed on the substrate; a metal catalyst layer disposed on the buffer layer; a semiconductor layer disposed on the metal catalyst layer; a gate insulating layer disposed on the entire surface of the substrate; a gate electrode disposed on the gate insulating layer at a position corresponding to the semiconductor layer; an interlayer insulating layer disposed on the entire surface of the substrate; and source and drain electrodes disposed on the interlayer insulating layer and connected to the semiconductor layer. The metal catalyst layer may include one selected from the group consisting of carbon, nitrogen, and halogen.

According to aspects of the present invention, a TFT includes: a substrate; a buffer layer disposed on the substrate; a semiconductor layer disposed on the buffer layer; a gate electrode disposed at a position corresponding to the semiconductor layer and electrically insulated from the semiconductor layer; a gate insulating layer to electrically insulate the gate electrode from the semiconductor layer; and source and drain electrodes electrically insulated from the gate electrode and partially connected to the semiconductor layer. The semiconductor layer may include one selected from the group consisting of carbon, nitride, and halogen.

According to aspects of the present invention, a method of fabricating a TFT includes: forming a substrate; forming a buffer layer on the substrate; forming a metal catalyst layer on the buffer layer; forming an amorphous silicon (a-Si) layer on the metal catalyst layer; annealing the substrate and crystallizing the a-Si layer into a polycrystalline silicon (poly-Si) layer; patterning the poly-Si layer and forming a semiconductor layer; forming a gate insulating layer on the entire surface of the substrate having the semiconductor layer; and forming source and drain electrodes electrically connected to the semiconductor layer. The metal catalyst layer may be formed using an atomic layer deposition (ALD) technique.

According to aspects of the present invention, a display device includes: a substrate; a buffer layer disposed on the substrate; a metal catalyst layer disposed on the buffer layer;

a semiconductor layer disposed on the metal catalyst layer; a gate insulating layer disposed on the entire surface of the substrate; a gate electrode disposed on the gate insulating layer at a position corresponding to the semiconductor layer; an interlayer insulating layer disposed on the entire surface of the substrate; source and drain electrodes disposed on the interlayer insulating layer and partially connected to the semiconductor layer; and a display panel having a first electrode electrically connected to one of the source and drain electrodes. The metal catalyst layer may include one selected from the group consisting of carbon, nitrogen, and halogen.

The display panel may be an organic light emitting diode, a liquid crystal display panel, or a plasma display panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
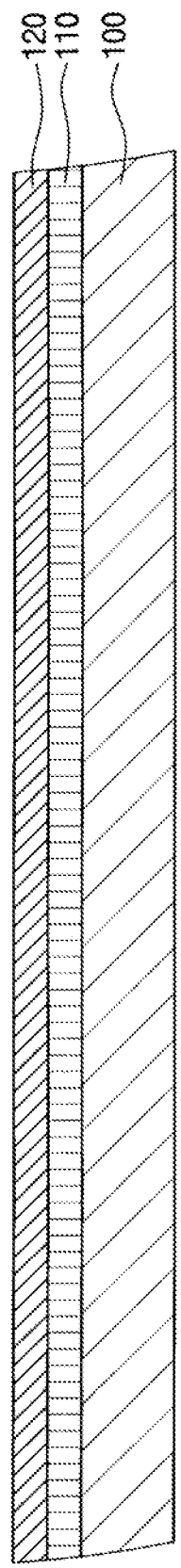
FIGS. 1A through 1D are cross-sectional views illustrating a method of fabricating a thin film transistor (TFT) according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. It will be understood that when an element is described as being one selected from a group consisting of a list, the element may be one selected from the list or one of each selected from the list. Further, it will be understood that when an element is referred to as being "formed on" or "disposed on" another element, it may be directly formed on or disposed on the other element or intervening elements may be present. In contrast, when an element is referred to as being "directly formed on" or "directly disposed on" another element, there are no intervening elements present. Other words used to describe the relationship between elements should be interpreted in a like fashion (e.g., "between" versus "directly between", "adjacent" versus "directly adjacent", etc.).

FIGS. 1A through 1D are cross-sectional views illustrating a method of fabricating a thin film transistor (TFT) according to an exemplary embodiment of the present invention. Referring to FIG. 1A, a buffer layer 110 is formed on a transparent insulating substrate 100 using a physical vapor deposition (PVD) or chemical vapor deposition (CVD) technique. However, aspects of the present invention are not limited thereto such that the buffer layer 110 may be formed by another method or may not be included in the TFT. The transparent insulating substrate 100 may be a glass substrate or a plastic substrate. The buffer layer 110 may be formed of a silicon oxide or a silicon nitride. The buffer layer 110 may prevent diffusion of moisture and/or impurities generated in the underlying substrate 100 or control the transmission rate of heat during a crystallization process, thereby facilitating the crystallization of an amorphous silicon (a-Si) layer 140a.

Thereafter, a metal catalyst layer 120 is formed on the buffer layer 110. The metal catalyst layer 120 may be formed using an atomic layer deposition (ALD) technique but is not limited thereto. A precursor used for the ALD technique may be an organic precursor or an inorganic precursor. The organic precursor may be a nickel nitride containing an alkyl group, and the alkyl group may be an alkyl chain, such as methyl, ethyl, or isopropyl but is not limited thereto such that the alkyl group may be a longer alkyl chain or another branched alkyl group. Also, the inorganic precursor may be a nickel halide, such as nickel chloride ($NiCl_2$), nickel iodide ($NiI_2$), nickel bromide ($NiBr_2$), or nickel fluoride ($NiF_2$) but is not limited thereto.

After the substrate 100 is loaded in a chamber, the precursor for the ALD technique may be injected into the chamber in a gaseous phase along with $H_2$ plasma, $H_2$ gas, $NH_3$, or $O_3$, thereby forming the Ni-containing metal catalyst layer 120 on the substrate 100. Also, after the precursor is injected into the chamber, $SiN_4$ gas may be further injected into the chamber, thereby forming a nickel silicide metal catalyst layer 120.

As the metal catalyst layer 120 is formed using the precursor, when the organic precursor is used, nitrogen or carbon of an alkyl group may remain in the metal catalyst layer 120, and when the inorganic precursor is used, a halogen element, such as chlorine (Cl), fluorine (F), or bromine (Br), may remain in the metal catalyst layer 120.

The metal catalyst layer 120 may include a metal selected from the group consisting of Pd, Ti, Ag, Au, Al, Sn, Sb, Cu, Co, Mo, Cr, Ru, Rh, Cd, Pt, Ni, and combinations thereof, and preferably Ni. When the metal catalyst layer 120 is formed of Ni, Ni may be diffused rapidly into a capping layer that will be formed later, and the a-Si 140a layer may be crystallized into a polycrystalline silicon (poly-Si) layer having good crystallization characteristics.

Also, the metal catalyst layer 120 may be formed to a thickness of about 10 to 40 Å. When the metal catalyst layer 120 is formed to a thickness less than 10 Å, it is difficult to form the metal catalyst layer 120 to a uniform thickness. When the metal catalyst layer 120 is formed to a thickness greater than 40 Å, a large amount of metal catalyst moves to the a-Si layer 140a so that a large amount of metal may remain in a semiconductor layer, thereby affecting the properties of the resultant TFT.

Figure 1B:
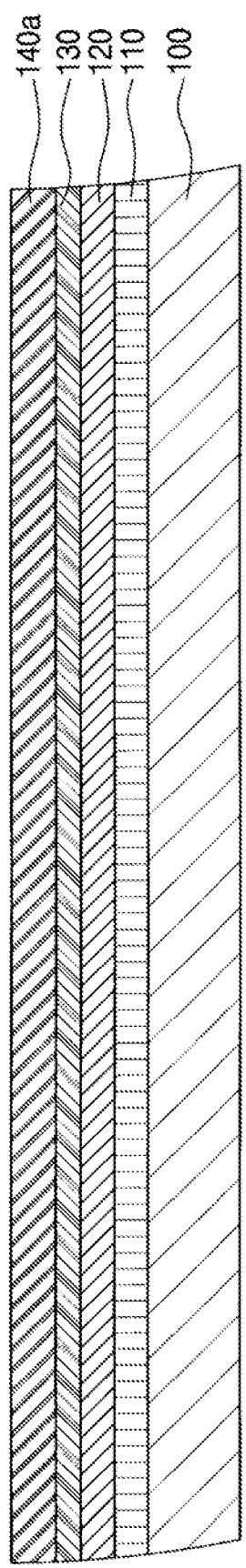

Referring to FIG. 1B, a capping layer 130 is formed on the metal catalyst layer 120 using a PVD or CVD technique but is not limited thereto. The capping layer 130 may be a silicon nitride layer but is not limited thereto. When the capping layer 130 is a silicon nitride layer having a refractive index of 1.9 or lower, diffusion of a metal catalyst is facilitated. Thereafter, an a-Si layer 140a is formed on the capping layer 130.

Although the capping layer 130 is illustrated as a single layer in FIG. 1B, the capping layer 130 is not limited thereto and may include at least two layers.

After the a-Si layer 140a is formed on the capping layer 130, the substrate 100 is annealed using a heating apparatus, such as a furnace, a rapid thermal annealing (RTA) system, or a laser.

Due to the annealing process, the metal catalyst of the metal catalyst layer 120 is diffused into the a-Si layer 140a. The annealing process may be performed at a temperature of about 750° C. or lower for several seconds to several hours.

After the metal catalyst is diffused from the metal catalyst layer 120 through the capping layer 130 to the a-Si layer 140a, crystal nuclei for crystallizing the a-Si layer 140a into a poly-Si layer, i.e., seeds (not shown), are formed. The a-Si layer 140a is crystallized into a poly-Si layer using the seeds, and the poly-Si layer is patterned, thereby forming a semiconductor layer 140, shown in FIG. 1C.

Remnants of the precursor used for forming the metal catalyst layer 120 by the ALD technique may remain in the semiconductor layer 140. When the organic precursor is used, nitrogen or carbon of an alkyl group may remain in the semiconductor layer 140, and when the inorganic precursor is used, a halogen element, such as chlorine (Cl), fluorine (F), or bromine (Br), may remain in the semiconductor layer 140.

Figure 1C:
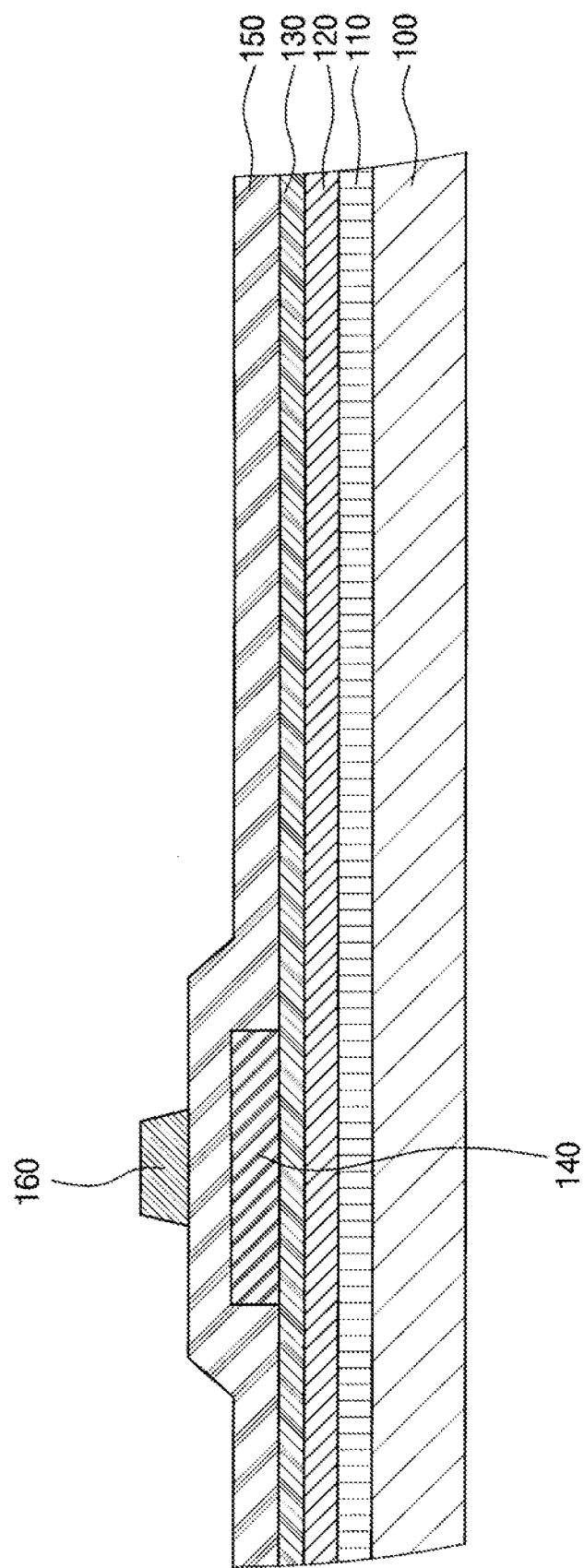
Figure 1D:
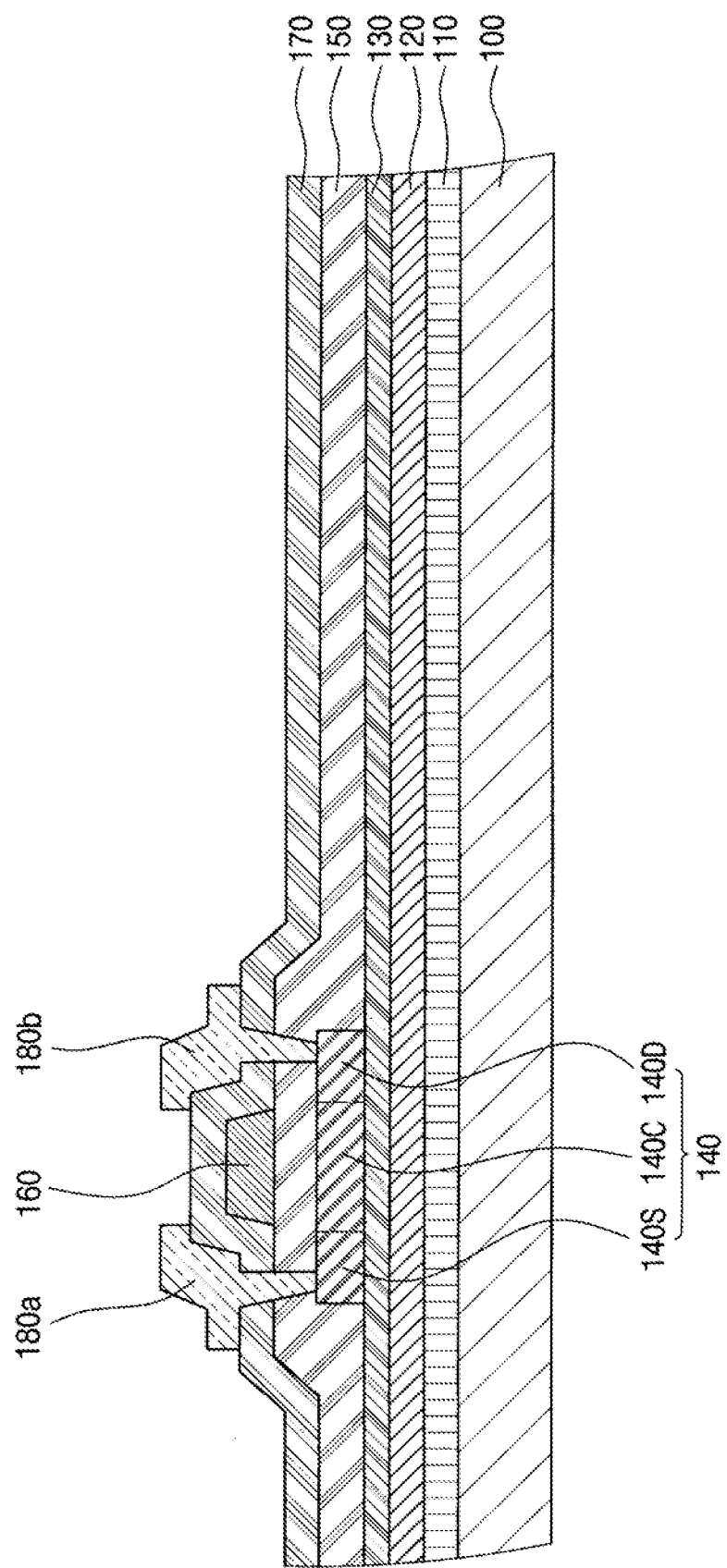

Referring to FIG. 1C, impurity ions are doped into the semiconductor layer 140, thereby forming a channel region 140C and source and drain regions 140S and 140D, shown in FIG. 1D. The channel region 140C may be n-doped or p-doped to thereby form an n-type or a p-type channel region 140C, respectively.

Thereafter, a gate insulating layer 150 is formed to cover the semiconductor layer 140, and a gate electrode 160 is patterned on the gate insulating layer 150 to correspond to the semiconductor layer 140. The gate insulating layer 150 may be formed to cover the entire surface of the substrate 100. The gate insulating layer 150 may be a silicon oxide layer, a silicon nitride layer, or a double layer thereof. The gate electrode 160 may be formed of a conductive metal or a conductive polymer. The conductive metal may be tungsten molybdenum (MoW), aluminum (Al), chlorine (Cl), or aluminum/chrome (Al/Cr).

Referring to FIG. 1D, an interlayer insulating layer 170 is formed to cover the gate electrode 160. The interlayer insulating layer 170 may be formed to cover the entire surface of the substrate 100. Source and drain electrodes 180a and 180b are formed to connect to the semiconductor layer 140. The source and drain electrodes 180a and 180b may be formed of one selected from the group consisting of molybdenum (Mo), chrome (Cr), tungsten (W), aluminum-neodymium (Al—Nd), titanium (Ti), tungsten molybdenum (MoW), aluminum (Al), and mixtures thereof. In the above-described process, the TFT according to aspects of the present invention is thereby completed.

FIGS. 2A through 2D are cross-sectional views illustrating a method of fabricating a TFT according to another exemplary embodiment of the present invention. The method according to FIGS. 2A through 2D is generally the same as the method according to the previous exemplary embodiment except that a metal catalyst layer 120 is formed on an a-Si layer 140a without forming a capping layer 130 and the a-Si layer 140a is crystallized and patterned to form a semiconductor layer 140. Thus, the same description as in the previous embodiment will be omitted here.

Figure 2A:
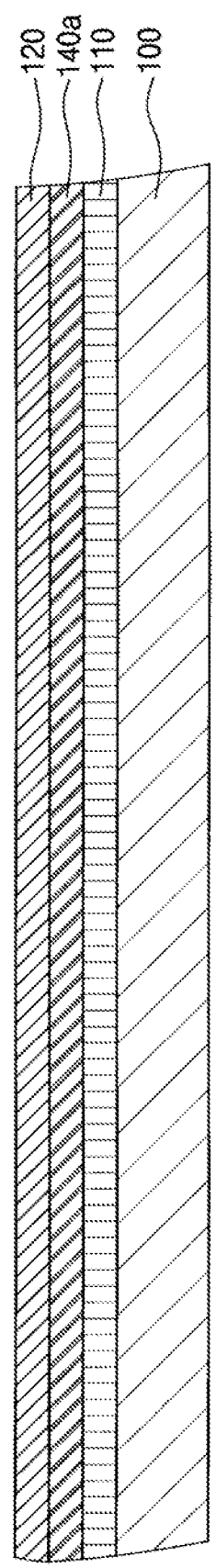
FIGS. 2A through 2D are cross-sectional views illustrating a method of fabricating a TFT according to an exemplary embodiment of the present invention.

Referring to FIG. 2A, a buffer layer 110 is formed on a transparent insulating substrate 100 using a PVD or CVD technique but is not limited thereto such that the buffer layer 110 may not be formed in the TFT. The buffer layer 110 may be a silicon oxide layer or a silicon nitride layer but is not limited thereto. The transparent insulating substrate 100 may be a glass substrate or a plastic substrate but is not limited thereto. The buffer layer 110 may prevent the diffusion of moisture or impurities generated in the underlying substrate 100 and/or control the transmission rate of heat during a crystallization process, thereby facilitating the crystallization of an a-Si layer 140a.

Thereafter, the a-Si layer 140a is formed on the buffer layer 110, and a metal catalyst layer 120 is formed on the a-Si layer 140a. The metal catalyst layer 120 may be formed using the ALD technique in the same manner as described above.

Specifically, a precursor used for the ALD technique may be an organic precursor or an inorganic precursor. The organic precursor may be a nickel nitride containing an alkyl group, and the alkyl group may be an alkyl chain, such as methyl, ethyl, or isopropyl but is not limited thereto such that the alkyl group may be a longer alkyl chain or another branched alkyl group. Also, the inorganic precursor may be a nickel halide, such as nickel chloride ($NiCl_2$), nickel iodide ($NiI_2$), nickel bromide ($NiBr_2$), or nickel fluoride ($NiF_2$).

After the substrate 100 is loaded in a chamber, the precursor for the ALD technique may be injected into the chamber in a gaseous phase along with $H_2$ plasma, $H_2$ gas, $NH_3$, or $O_3$, thereby forming the Ni-containing metal catalyst layer 120 on the a-Si layer 140a. Also, after the precursor is injected into the chamber, $SiN_4$ gas may be further injected into the chamber, thereby forming a nickel silicide metal catalyst layer 120.

As the metal catalyst layer 120 is formed using the precursor, when the organic precursor is used, nitrogen or carbon of an alkyl group may remain in the metal catalyst layer 120, and when the inorganic precursor is used, a halogen element, such as chlorine (Cl), fluorine (F), or bromine (Br), may remain in the metal catalyst layer 120.

The metal catalyst layer 120 may be formed to include a metal selected from the group consisting of Pd, Ti, Ag, Au, Al, Sn, Sb, Cu, Co, Mo, Cr, Ru, Rh, Cd, Pt, Ni, and combinations thereof, and preferably Ni. When the metal catalyst layer 120 is formed of Ni, Ni may be diffused rapidly into a capping layer that will be formed later, and the a-Si layer 140a may be crystallized into a poly-Si layer having good crystallization characteristics.

Also, the metal catalyst layer 120 may be formed to a thickness of about 10 to 40 Å. When the metal catalyst layer 120 is formed to a thickness less than 10 Å, it is difficult to form the metal catalyst layer 120 to a uniform thickness. When the metal catalyst layer 120 is formed to a thickness greater than 40 Å, a large amount of metal catalyst moves to the a-Si layer 140a so that a large amount of metal may remain in a semiconductor layer, thereby affecting the properties of the resultant TFT.

After that, the substrate 100 is annealed using a heating apparatus, such as a furnace, an RTA system, or a laser, thereby crystallizing the a-Si layer 140a. The annealing process may be performed at a temperature of about 750° C. or lower for several seconds to several hours. As a result of the annealing process, crystal nuclei for crystallizing the a-Si layer 140a into a poly-Si layer, i.e., seeds (not shown), are formed. The a-Si layer 140a is crystallized into the poly-Si layer using the seeds.

Figure 2B:
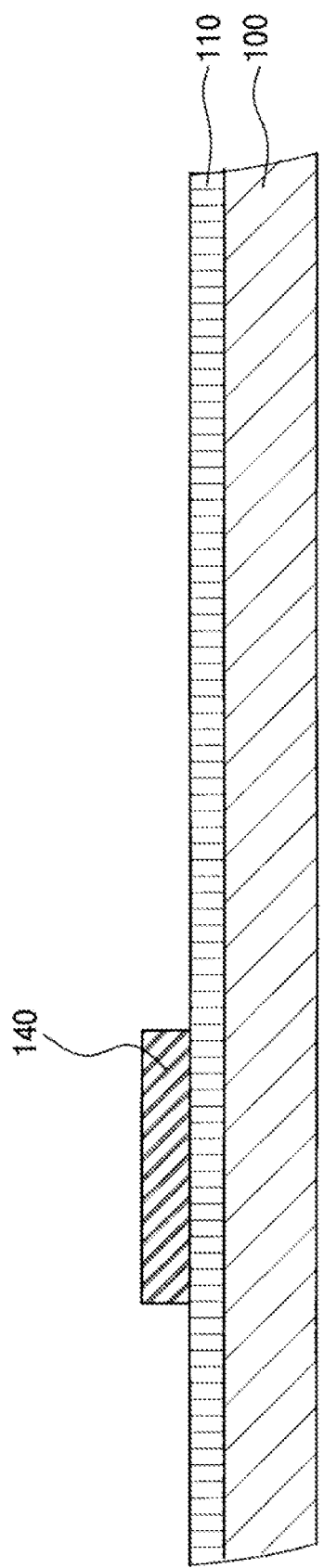

Thereafter, the metal catalyst layer 120 is removed by etching, and the poly-Si layer is patterned, thereby forming a semiconductor layer 140 as shown in FIG. 2B. Remnants of the precursor used for forming the metal catalyst layer 120 by the ALD technique may remain in the semiconductor layer 140. When the organic precursor is used, nitrogen or carbon of an alkyl group may remain in the semiconductor layer 140, and when the inorganic precursor is used, a halogen element, such as chlorine (Cl), fluorine (F), or bromine (Br), may remain in the semiconductor layer 140.

In order to reduce the remaining amount of the metal catalyst of the semiconductor layer 140, a capping layer (not shown) may be formed between the a-Si layer 140a and the metal catalyst layer 120, and the a-Si layer 140a may be crystallized into the poly-Si layer.

Figure 2C:
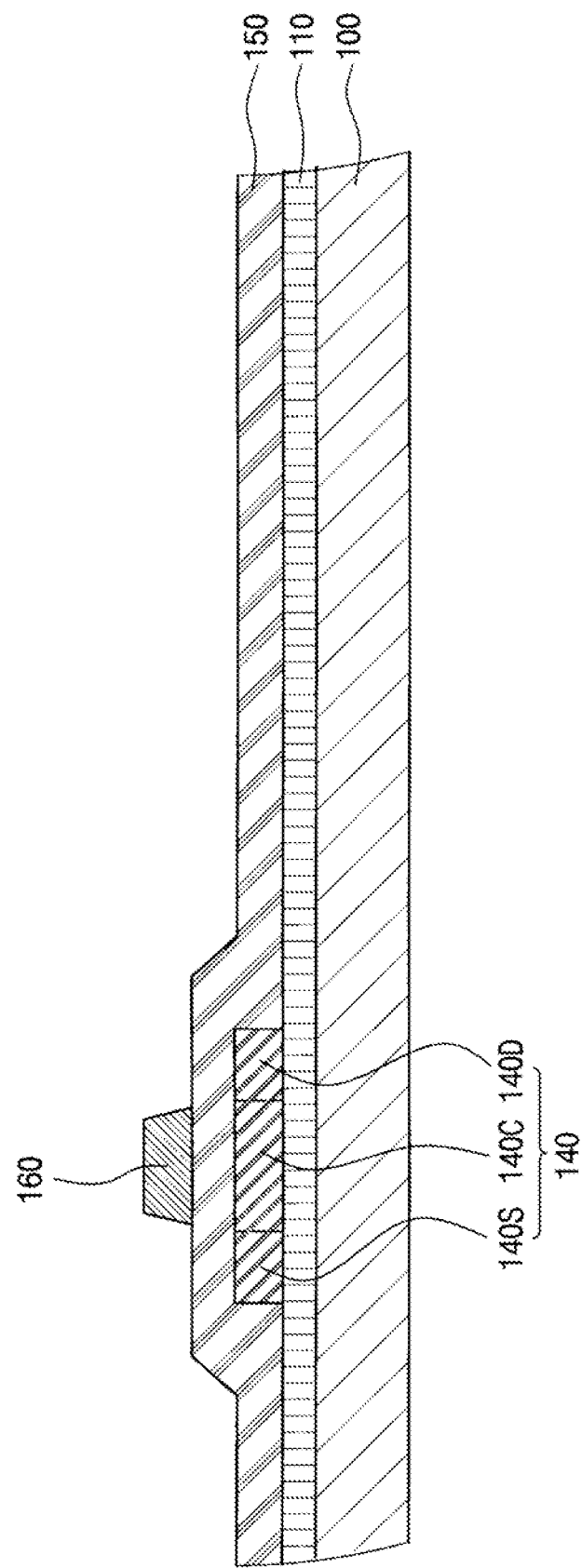

Referring to FIG. 2C, impurity ions are doped into the semiconductor layer 140, thereby forming a channel region 140C and source and drain regions 140S and 140D. The channel region 140C may be n-doped or p-doped to thereby form an n-type or a p-type channel region 140C, respectively.

Thereafter, a gate insulating layer 150 is formed to cover the semiconductor layer 140, and a gate electrode 160 is patterned on the gate insulating layer 150 to correspond to the semiconductor layer 140. The gate insulating layer 150 may be formed to cover the entire surface of the substrate 100. The gate insulating layer 150 may be a silicon oxide layer, a silicon nitride layer, or a double layer thereof. The gate electrode 160 may be formed of a conductive metal or a conductive polymer. The conductive metal may be MoW, Al, Cl, or Al/Cr but is not limited thereto.

Figure 2D:
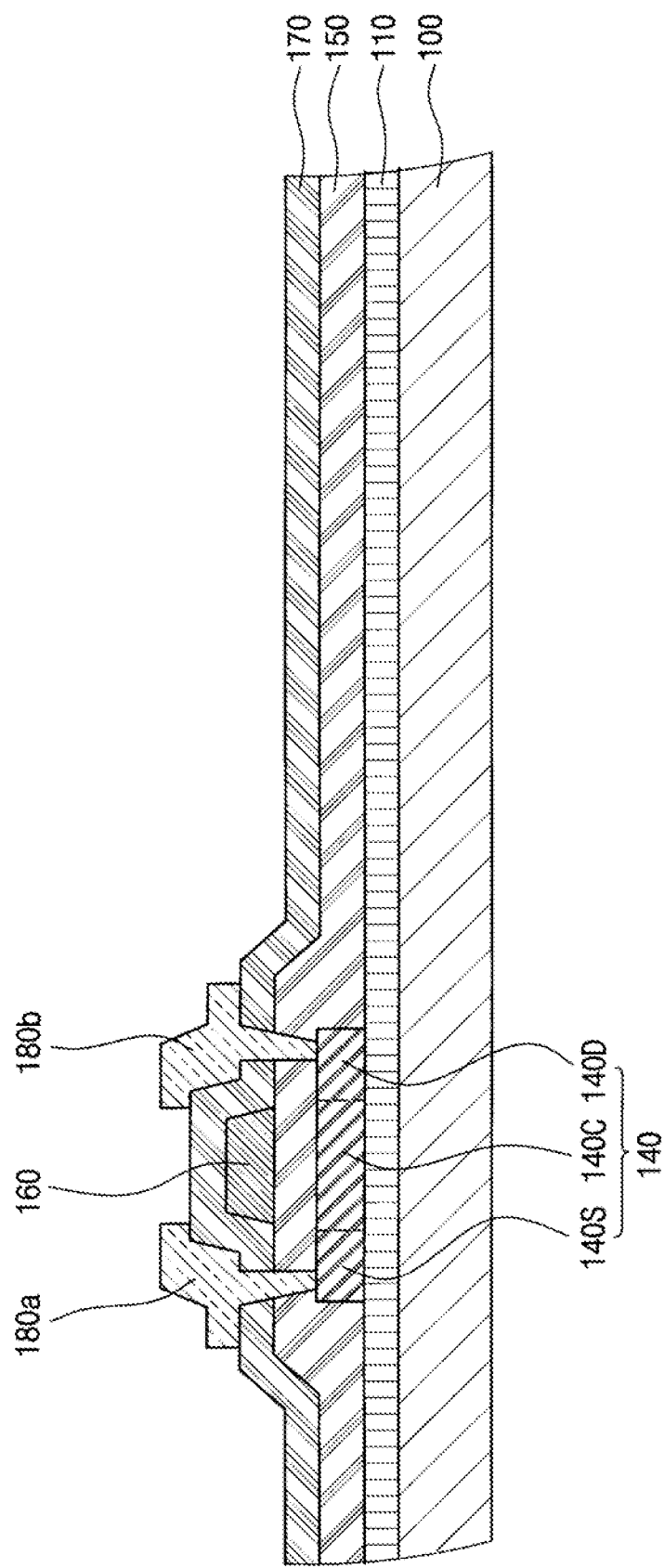

Referring to FIG. 2D, an interlayer insulating layer 170 is formed to cover the gate electrode 160. The interlayer insulating layer 170 may be formed to cover the entire surface of the substrate 100. Source and drain electrodes 180a and 180b are formed to connect to the semiconductor layer 140. The source and drain electrodes 180a and 180b may be formed of one selected from the group consisting of molybdenum (Mo), chrome (Cr), tungsten (W), aluminum-neodymium (Al—Nd), titanium (Ti), tungsten molybdenum (MoW), aluminum (Al), and mixtures thereof. In the above-described process, the TFT according to aspects of the present invention is thereby completed.

Figure 3:
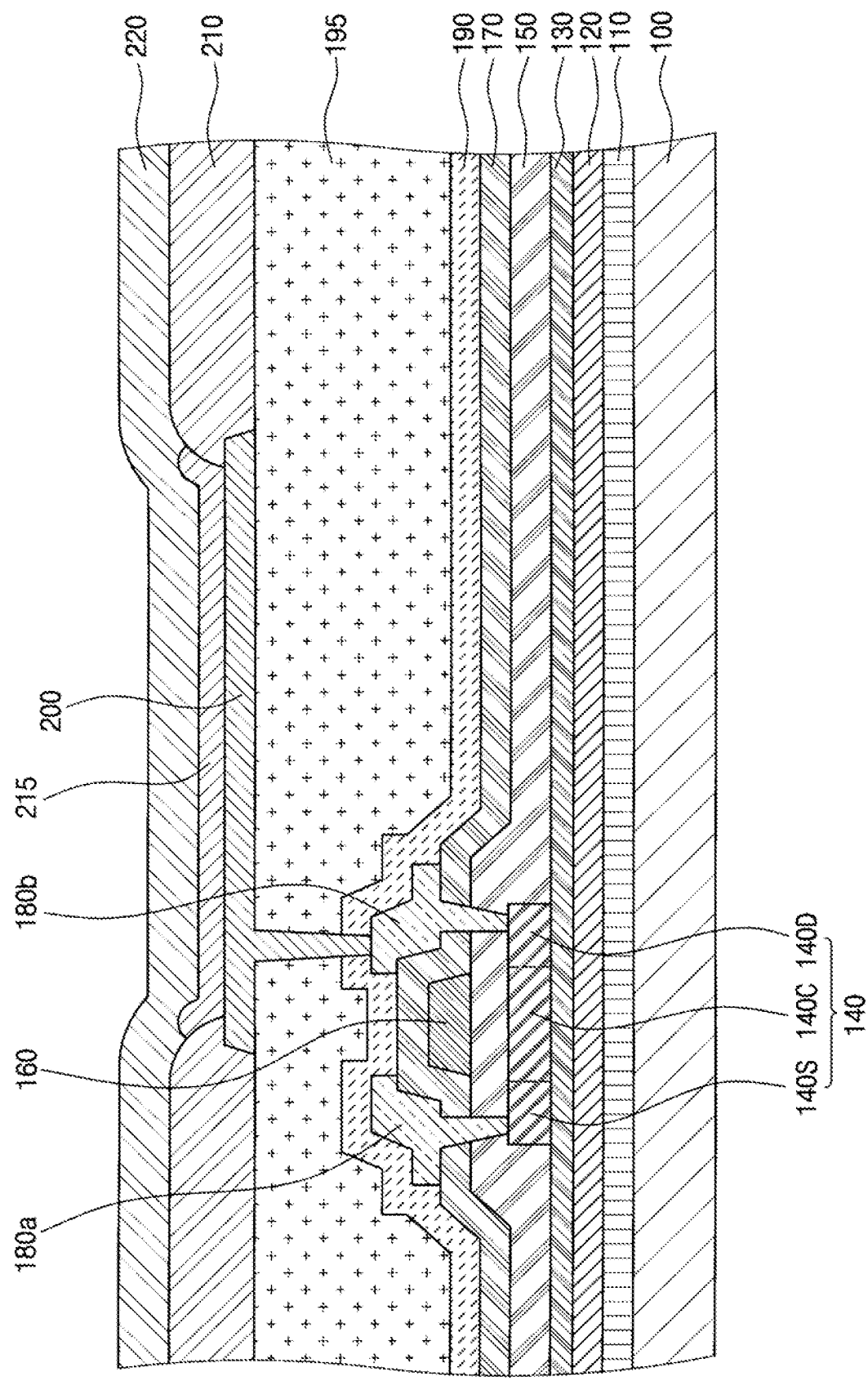
FIG. 3 is a cross-sectional view of an organic light emitting diode (OLED) display device according to an exemplary embodiment of the present invention.

FIG. 3 is a cross-sectional view of an organic light emitting diode (OLED) display device according to an exemplary embodiment of the present invention. Since the OLED display device of FIG. 3 includes the TFT described with reference to FIGS. 1A through 1D, a description of the same components will be omitted here. Although described and illustrated herein as an OLED display device, the TFT according to aspects of the present invention may be used in other display devices, such as a liquid crystal display device or a plasma display device.

Referring to FIG. 3, a protection layer 190 is formed to cover the source and drain electrodes 180a and 180b, and a planarization layer 195 is formed thereon. However, aspects of the present invention are not limited thereto such that the protection layer 190 and the planarization layer 195 may be formed to cover the entire substrate.

Thereafter, a first electrode 200 is formed on the planarization layer 195, and the first electrode 200 is electrically connected to one of the source and drain electrodes 180a and 180b.

A pixel defining layer 210 to define pixels is formed on the first electrode 200, and an organic layer 215 including an organic emission layer (EML) is formed on the pixel defining layer 210.

Subsequently, a second electrode 220 is formed on the organic layer 215. However, aspects of the present invention are not limited thereto such that the second electrode 220 may be formed across the entire substrate 100. Thus, the fabrication of the OLED display according to aspects of the present invention is completed.

Although it is described that the OLED display device includes the TFT described with reference to FIGS. 1A through 1D, an OLED display device according to another embodiment of the present invention may include the TFT described with reference to FIGS. 2A through 2D.

According to aspects of the present invention as described above, in order to crystallize an a-Si layer into a poly-Si layer using a metal catalyst, a metal catalyst layer can be formed by an ALD technique, and the poly-Si layer may be formed to a smaller thickness than in conventional deposition methods. As a result, the a-Si layer can be crystallized using a small amount of metal catalyst, thereby producing a TFT in which the remaining amount of metal catalyst of a semiconductor layer is reduced.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents. For example, although only a top-gate TFT is described above in the exemplary embodiments, the present invention may be applied to a bottom-gate TFT. Further, the top-gate TFT and the bottom-gate TFT may be applied to a liquid-crystal display device or other display device.

What is claimed is:

1. A thin film transistor (TFT), comprising:
a substrate;
a metal catalyst layer disposed on the substrate;
a capping layer disposed on the metal catalyst layer;
a semiconductor layer disposed on the capping layer;
a gate insulating layer disposed to cover the semiconductor layer;
a gate electrode disposed on the gate insulating layer to correspond to the semiconductor layer;
an interlayer insulating layer disposed to cover the gate electrode; and
source and drain electrodes disposed on the interlayer insulating layer and connected to the semiconductor layer,
wherein the metal catalyst layer includes one selected from the group consisting of carbon, nitrogen, and a halogen and
wherein the capping layer is a silicon nitride layer having a refractive index of 1.9 or lower.

2. The TFT of claim 1, wherein the metal catalyst layer has a thickness of about 10 to 40 Å.

3. The TFT of claim 1, wherein the metal catalyst layer is formed of one of nickel and nickel silicide.

4. The TFT of claim 1, wherein the semiconductor layer includes one selected from the group consisting of carbon, nitrogen, and a halogen.

5. The TFT of claim 1, further comprising a buffer layer disposed between the substrate and the metal catalyst layer.

6. A method of fabricating a thin film transistor (TFT), the method comprising:
forming a metal catalyst layer on a substrate;
forming an amorphous silicon (a-Si) layer on the metal catalyst layer;
annealing the substrate to crystallize the a-Si layer into a polycrystalline silicon (poly-Si) layer;
patterning the poly-Si layer to form a semiconductor layer;
forming a gate insulating layer to cover the semiconductor layer; and
forming source and drain electrodes electrically connected to the semiconductor layer,
wherein the metal catalyst layer is formed using an atomic layer deposition (ALD) technique.

7. The method of claim 6, wherein the metal catalyst layer is formed of nickel or nickel silicide.

8. The method of claim 6, wherein the metal catalyst layer is formed to a thickness of about 10 to 40 Å.

9. The method of claim 6, further comprising forming a capping layer disposed between the metal catalyst layer and the a-Si layer.

10. The method of claim 6, further comprising forming a buffer layer disposed between the substrate and the metal catalyst layer.

11. The method of claim 6, wherein the annealing is performed at a temperature of about 750° C. or less.

12. The method of claim 6, wherein the ALD technique is performed using an inorganic precursor or an organic precursor.

13. The method of claim 12, wherein the organic precursor is a nickel nitride containing an alkyl group.

14. The method of claim 12, wherein the inorganic precursor is a nickel halide.

15. A display device, comprising:
a substrate;
a metal catalyst layer disposed on the substrate;
a capping layer disposed on the metal catalyst layer;
a semiconductor layer disposed on the capping layer;
a gate insulating layer disposed to cover the semiconductor layer;
a gate electrode disposed on the gate insulating layer at a position corresponding to the semiconductor layer;
an interlayer insulating layer disposed on the to cover the gate electrode;
source and drain electrodes disposed on the interlayer insulating layer and connected to the semiconductor layer; and
a display panel having a first electrode connected to the one of the source and drain electrodes,
wherein the metal catalyst layer includes one selected from the group consisting of carbon, nitrogen, and a halogen, and
wherein the capping layer is a silicon nitride layer having a refractive index of 1.9 or lower.

16. The display device of claim 15, wherein the display panel comprises:
an organic layer disposed on the first electrode to emit light; and
a second electrode disposed on the organic layer.

17. The display device of claim 15, wherein the display panel is a liquid crystal display panel or a plasma display panel.

18. The display device of claim 15, wherein the metal catalyst layer has a thickness of about 10 to 40 Å.

19. The display device of claim 15, wherein the metal catalyst layer includes one of nickel and nickel silicide.

20. The display device of claim 15, further comprising a buffer layer disposed between the metal catalyst layer and the substrate.

* * * * *